(12) United States Patent
Hikichi

(10) Patent No.: US 8,723,254 B2
(45) Date of Patent: May 13, 2014

(54) SEMICONDUCTOR DEVICE AND MANUFACTURING METHOD THEREOF

(75) Inventor: Toshiaki Hikichi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 259 days.

(21) Appl. No.: 12/825,972

(22) Filed: Jun. 29, 2010

(65) Prior Publication Data

US 2011/0095302 A1    Apr. 28, 2011

(30) Foreign Application Priority Data

Oct. 26, 2009  (JP) .................................. 2009-245046

(51) Int. Cl.
*H01L 29/78* (2006.01)

(52) U.S. Cl.
USPC .......................................... 257/332; 257/331

(58) Field of Classification Search
USPC .................................. 257/331, 332
See application file for complete search history.

(56) References Cited

U.S. PATENT DOCUMENTS

| | | | |
|---|---|---|---|
| 6,020,600 A * | 2/2000 | Miyajima et al. ............... | 257/76 |
| 6,274,905 B1 * | 8/2001 | Mo ................................. | 257/330 |
| 6,621,107 B2 * | 9/2003 | Blanchard et al. ............. | 257/155 |
| 6,674,124 B2 * | 1/2004 | Hshieh et al. .................. | 257/330 |
| 6,861,701 B2 * | 3/2005 | Williams et al. ............... | 257/329 |
| 6,888,196 B2 | 5/2005 | Kobayashi | |
| 7,173,307 B2 * | 2/2007 | Hayashi et al. ................ | 257/330 |
| 7,423,316 B2 * | 9/2008 | Kawaji et al. .................. | 257/330 |
| 7,541,642 B2 * | 6/2009 | Kawamura et al. ............ | 257/331 |
| 7,582,932 B2 * | 9/2009 | Kumar et al. .................. | 257/332 |
| 7,586,151 B2 * | 9/2009 | Takaya et al. .................. | 257/330 |
| 7,772,641 B2 * | 8/2010 | Omura et al. .................. | 257/330 |
| 8,008,715 B2 * | 8/2011 | Kawaguchi et al. ........... | 257/331 |
| 2002/0024091 A1 | 2/2002 | Mo | |
| 2003/0089946 A1 * | 5/2003 | Hshieh et al. .................. | 257/338 |
| 2004/0021174 A1 | 2/2004 | Kobayashi | |
| 2005/0062048 A1 * | 3/2005 | Hayashi et al. ................ | 257/77 |

(Continued)

FOREIGN PATENT DOCUMENTS

| | | |
|---|---|---|
| CN | 1334605 A | 2/2002 |
| CN | 1822394 A | 8/2006 |

(Continued)

OTHER PUBLICATIONS

Korean Office Action with Japanese Translation issued Mar. 27, 2012 in Patent Application No. 10-2010-0094042 with Partial English Translation.

(Continued)

*Primary Examiner* — David Vu
*Assistant Examiner* — Earl Taylor
(74) *Attorney, Agent, or Firm* — Oblon, Spivak, McClelland, Maier & Neustadt, L.L.P.

(57) ABSTRACT

An object is to provide a semiconductor device and its manufacturing method in which delay in switching and non-uniform operations are prevented and in which stresses occurring in trench regions are alleviated as much as possible. A gate electrode in a gate trench is formed of a polysilicon layer and a gate tungsten layer that is lower resistant than the polysilicon layer. Also, a source electrode is formed of source tungsten layers buried in source trenches and an AlSi layer in contact with the source tungsten layers and covering source layers and the gate electrodes with a thick insulating film interposed therebetween.

8 Claims, 17 Drawing Sheets

(56) References Cited

U.S. PATENT DOCUMENTS

| | | |
|---|---|---|
| 2005/0199953 A1 | 9/2005 | Kawamura et al. |
| 2006/0097268 A1* | 5/2006 | Kumar et al. .................. 257/77 |
| 2006/0273390 A1 | 12/2006 | Hshieh et al. |
| 2007/0023828 A1* | 2/2007 | Kawamura et al. ........... 257/330 |
| 2007/0241394 A1* | 10/2007 | Takaya et al. ................. 257/330 |
| 2007/0267672 A1 | 11/2007 | Hokomoto et al. |
| 2008/0012040 A1* | 1/2008 | Saito et al. .................... 257/133 |
| 2009/0026546 A1 | 1/2009 | Shimada et al. |
| 2011/0095302 A1* | 4/2011 | Hikichi .......................... 257/77 |

FOREIGN PATENT DOCUMENTS

| | | |
|---|---|---|
| CN | 101465374 A | 6/2009 |
| JP | 2003-318396 A | 11/2003 |
| JP | 2007-35841 | 2/2007 |
| JP | 2007-35841 A | 2/2007 |
| JP | 2007-311557 | 11/2007 |
| JP | 2007-311557 A | 11/2007 |
| JP | 2009-099872 A | 5/2009 |
| KR | 10-2005-0032753 | 4/2005 |

OTHER PUBLICATIONS

German Office Action Issued Feb. 6, 2013 in Patent Application No. 10 2010 042 929.5 (with partial English translation).

Combined Chinese Office Action and Search Report issued Oct. 22, 2012, in Patent Application No. 201010267697.0 (with partial English-language translation).

Office Action issued Jul. 30, 2013 in Japanese Patent Application No. 2009-245046 (with partial English language translation).

* cited by examiner

F I G. 6
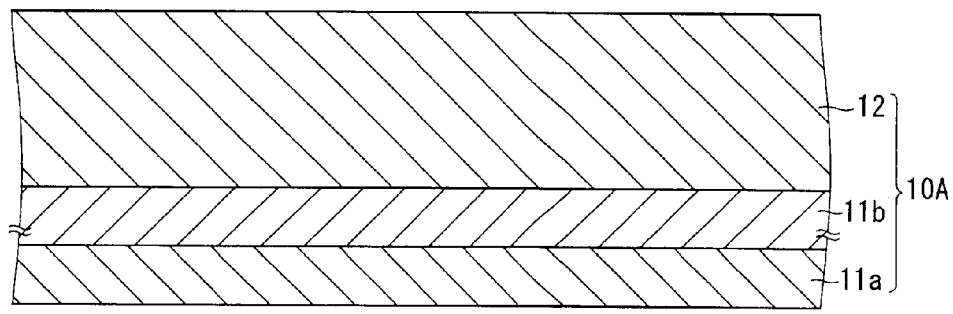
F I G. 7
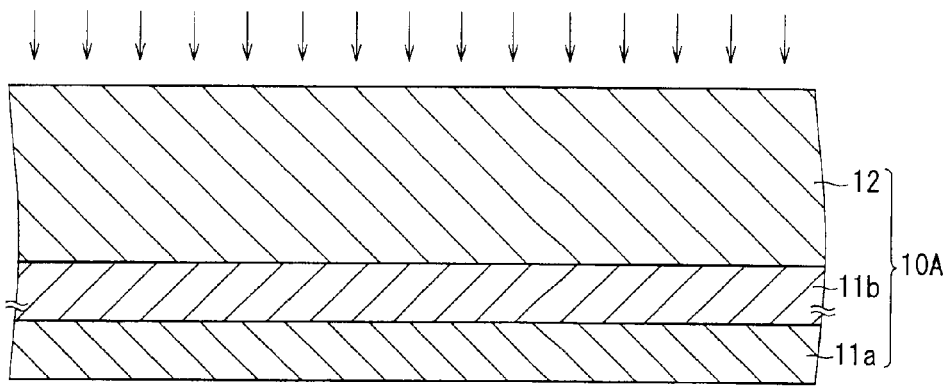

F I G . 8
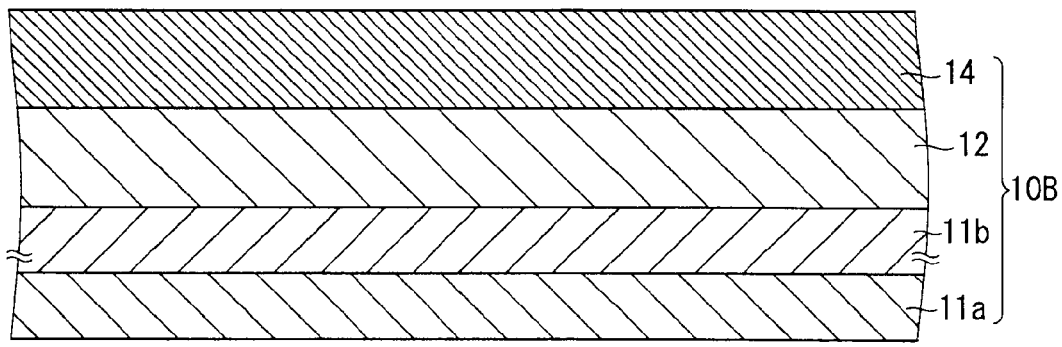
F I G . 9
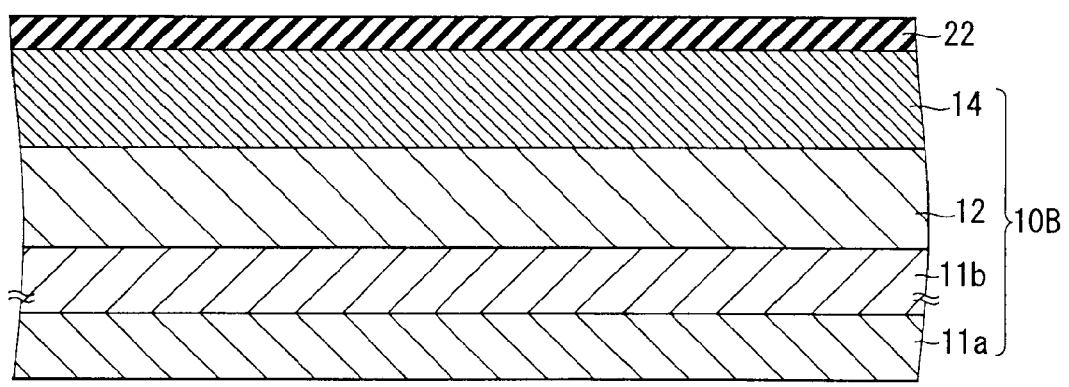

SEMICONDUCTOR DEVICE AND MANUFACTURING METHOD THEREOF

BACKGROUND OF THE INVENTION

1. Field of the Invention

The present invention relates to a semiconductor device whose gate and source electrodes have trench structures, and a method of manufacturing the same.

2. Description of the Background Art

In power semiconductor devices, a large number of unit cells having the same structure are connected in parallel in order to achieve characteristics such as high-speed switching, reduction of the resistance in conducting state caused by high current density (hereinafter also referred to as "on-state resistance"), and high breakdown withstand voltage. In the development of power semiconductor devices, miniaturization is now in progress for purposes such as the reduction of on-state resistance.

Particularly, miniaturization techniques for low-voltage power MOSFETs (Metal Oxide Semiconductor Field Effect Transistors) are being developed, for pattern miniaturization is directly connected to performance. Devices according to leading-edge miniaturization techniques are adopting double trench cell structure in which not only gate electrode contacts but also source electrode contacts have trench structures (for example, see Japanese Patent Application Laid-Open Nos. 2007-35841, 2007-311557, and 2003-318396, hereinafter respectively referred to as Patent Documents 1 to 3).

Gate electrodes and source electrodes in the double trench cell structure are formed by forming an electrode film to fill a trench by sputtering, for example. It is difficult to fill a trench with an electrode film formed by sputtering, so that voids are likely to form inside the electrode and increase the electrode resistance. Also, the electrode tends to rise up over the trench to form irregularities on the electrode surface, leading to increased connection resistance with external interconnections like wire bonding.

For example, Patent Document 3 mentioned above discloses a technique related to the surface configuration of electrodes. In the technique disclosed in Patent Document 3, tungsten is buried as a plug in a contact hole corresponding to a trench by, e.g. Chemical Vapor Deposition (CVD), and then a source electrode is formed thereon, so that the surface of the source electrode is formed flat.

As described above, power MOSFETs are now in progress toward miniaturization. The progress toward miniaturization leads to increased gate resistance and increased delay in switching due to increased time constant CR. Also, the increased gate resistance causes variations in switching speed in a single chip, leading to non-uniform operations.

Furthermore, since a large number of trenches, about twice or more times those in conventional ones, are packed in fine areas, stresses occurring in trench regions cause problems in large-current and high-temperature operating power devices. Excessive stresses will cause crystal defects and increased leakage, and it is therefore necessary to alleviate stresses as much as possible.

Patent Documents 1 to 3 mentioned above disclose no technique for solving these problems.

SUMMARY OF THE INVENTION

An object of the present invention is to provide a semiconductor device and its manufacturing method in which delays in switching and non-uniform operations are prevented and in which stresses occurring in trench regions are alleviated as much as possible.

A semiconductor device according to the present invention includes a first semiconductor layer of a first conductivity type, a second semiconductor layer of a second conductivity type, a third semiconductor layer of the first conductivity type, a gate electrode, a fourth semiconductor layer of the second conductivity type, and a contact electrode.

The second semiconductor layer is formed in a surface portion of the first semiconductor layer on one thickness direction side. The third semiconductor layer is selectively formed in a surface portion of the second semiconductor layer on the one thickness direction side. The gate electrode is buried in a gate trench passing through the second and third semiconductor layers to reach the first semiconductor layer, with a gate insulating film interposed therebetween. The fourth semiconductor layer is formed in a portion of the second semiconductor layer that forms a bottom of a contact trench passing through the third semiconductor layer to reach the second semiconductor layer, and the fourth semiconductor layer has a higher concentration of the second conductivity type impurity than the second semiconductor layer. The contact electrode is buried in the contact trench and is in contact with the third and fourth semiconductor layers.

The gate electrode includes an internal gate electrode and a low-resistance gate electrode. The internal gate electrode is buried in a part of the gate trench including its bottom. The low-resistance gate electrode is buried in a remaining part of the gate trench and is in contact with the internal gate electrode, and the low-resistance gate electrode is lower resistant than the internal gate electrode.

The contact electrode includes a first conductor layer and a second conductor layer. The first conductor layer is buried in the contact trench. The second conductor layer is in contact with the first conductor layer and covers the third semiconductor layer and the gate electrode with an interlayer insulating film interposed therebetween.

The first conductor layer and the second conductor layer are made of different materials, and the low-resistance gate electrode and the first conductor layer are made of the same material.

According to the semiconductor device, it is possible to suppress formation of voids in the contact trench to prevent the increase of the resistance of the contact electrode caused by miniaturization, and it is also possible to prevent the increase of the connection resistance with external interconnections.

Also, delays in switching are prevented since the increase of the resistance of the gate electrode caused by miniaturization is suppressed. Also, variations in switching speed among unit cells in the semiconductor device are suppressed, and non-uniform operations of the unit cells are prevented.

Also, structural uniformity is improved and stresses occurring in the regions where gate and contact trenches are formed are alleviated. Also, the occurrence of crystal defects such as dislocations is suppressed and adverse effects due to crystal defects, such as increased leakage current, are prevented.

A semiconductor device manufacturing method of the present invention includes the following process steps (a) to (g).

In step (a), in a surface portion of a first semiconductor layer of a first conductivity type on one thickness direction side, a second semiconductor layer of a second conductivity type is formed.

In step (b), a third semiconductor layer of the first conductivity type is selectively formed in a surface portion of the second semiconductor layer on the one thickness direction side.

In step (c), a gate trench passing through the second and third semiconductor layers to reach the first semiconductor layer is formed.

In step (d), a gate electrode is formed in the gate trench, with a gate insulating film interposed therebetween.

In step (e), a contact trench passing through the third semiconductor layer to reach the second semiconductor layer is formed.

In step (f), a fourth semiconductor layer of the second conductivity type having a higher concentration of the second conductivity type impurity than the second semiconductor layer is formed in a portion of the second semiconductor layer that forms a bottom of the contact trench.

In step (g), a contact electrode is formed such that it is in contact with the third and fourth semiconductor layers in the contact trench.

The step (d) includes the following steps (d-1) and (d-2).

In step (d-1), an internal gate electrode is formed by filling a part of the gate trench including its bottom with a conductive material, with the gate insulating film interposed therebetween.

In step (d-2), a low-resistance gate electrode in contact with the internal gate electrode is formed by filling a remaining part of the gate trench with a conductive material that is lower resistant than the conductive material of the internal gate electrode, with the gate insulating film interposed therebetween.

The step (g) includes the following steps (g-1) and (g-2).

In step (g-1), a first conductor layer is formed by filling the contact trench with the same conductive material as the conductive material forming the low-resistance gate electrode.

In step (g-2), a second conductor layer is formed by using a conductive material that is different from the conductive material forming the first conductor layer such that the second conductor layer is in contact with the first conductor layer and covers the third semiconductor layer and the gate electrode, with an interlayer insulating film interposed therebetween.

According to the semiconductor device manufacturing method, it is possible to suppress formation of voids in the contact trench to prevent the increase of the resistance of the contact electrode caused by miniaturization, and it is also possible to prevent the increase of the connection resistance with external interconnections.

Also, it is possible to form a gate electrode in which the increase of the resistance caused by miniaturization is suppressed. Also, delays in switching are prevented and variations in switching speed among unit cells in the semiconductor device are suppressed, and non-uniform operations of the unit cells are prevented.

Also, structural uniformity is improved, and a semiconductor device can be manufactured in which stresses occurring in the regions where gate and contact trenches are formed are alleviated. Also, the occurrence of crystal defects such as dislocations is suppressed, and adverse effects due to crystal defects, such as increased leakage current, are prevented.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a cross-sectional view illustrating the semiconductor substrate 10A after the base layer 12 has been formed;

FIG. 7 is a cross-sectional view illustrating the semiconductor substrate 10A in a step of applying ion implantation to a portion to be a source layer 14;

FIG. 8 is a cross-sectional view illustrating the semiconductor substrate 10B after the source layer 14 has been formed;

FIG. 9 is a cross-sectional view illustrating the semiconductor substrate 10B after a second oxide film 22 has been formed;

DESCRIPTION OF THE PREFERRED EMBODIMENTS

Antecedent Technique

Before describing the semiconductor device according to the present invention and its manufacturing method, a semiconductor device as an antecedent technique of the present invention and its manufacturing method will be described. In the description below, a double trench cell MOS (Metal Oxide Semiconductor) field effect transistor (FET) will be described as an example of a semiconductor device. MOS field effect transistor is hereinafter referred to as "MOSFET".

Figure 1:
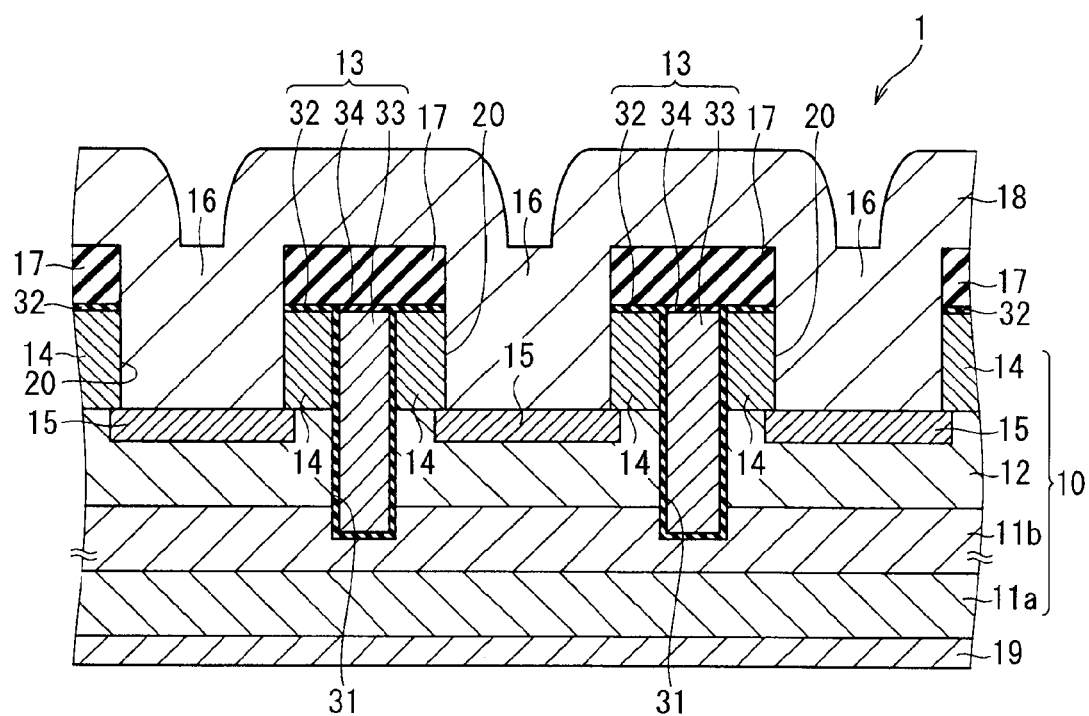
FIG. 1 is a cross-sectional view illustrating the structure of a MOSFET 1 according to an antecedent technique of the present invention.

FIG. 1 is a cross-sectional view illustrating the structure of a MOSFET 1 according to an antecedent technique of the present invention. The MOSFET 1 is an n-channel MOSFET in which a first conductivity type is n type and a second conductivity type is p type. The MOSFET 1 has a semiconductor substrate 10 in which gate trenches 31 and source trenches 20 are formed. The semiconductor substrate 10 includes a low-concentration n type (hereinafter also referred to as "n− type") semiconductor layer (hereinafter also referred to as "n− layer") 11b formed by epitaxial growth on a high-concentration n type (hereinafter also referred to as "n+ type") semiconductor substrate (hereinafter also referred to as "n+ substrate") 11a.

A p type base layer 12, in which a channel forms during conduction, is formed in the surface portion of the semiconductor substrate 10 on one thickness direction side, or specifically in the surface portion of the n− layer 11b on the one thickness direction side. The base layer 12 forms part of the surface of the n− layer 11b on the one thickness direction side. Gate trenches 31 are formed through the base layer 12 to form trench gate structures 13. A trench gate structure 13 includes a gate oxide film 32 formed on the inner walls of the gate trench 31, a gate electrode 33 formed in the gate trench 31 with the gate oxide film 32 interposed therebetween, and a cap oxide film 34 on the gate electrode 33. The MOSFET 10 includes a plurality of trench gate structures 13. The regions divided by the gate trenches 31 of the trench gate structures 13 form unit cells as constituent units of the double trench cell structure.

N+ type source layers 14, shallower than the base layer 12, are formed in the surface portions of the base layer 12 on the one thickness direction side, with the trench gate structures 13 interposed therebetween. Two source layers 14 on both sides of a trench gate structure 13 form two adjacent unit cells. Each unit cell includes a source layer 14 provided on one side of a trench gate structure 13 and a source layer 14 provided on the other side of another trench gate structure 13 adjacent to that trench gate structure 13.

A source trench 20 is formed between source layers 14 in each unit cell. The source trenches 20 are formed shallower than the gate trenches 31 of the trench gate structures 13. A high-concentration p type (hereinafter also referred to as "p+ type") well layers 15, higher concentration of p type impurity than the base layer 12, are formed in the surface portions of the base layer 12 that form the bottoms of the source trenches 20. The source layers 14 and well layers 15 form part of the surface portion of the base layer 12 on the one thickness direction side.

Miniaturization of the unit cell structures of the MOSFET 1 can be achieved only to a limited degree just by miniaturizing the width of the gate trenches 31 and the widths of diffusion layers such as the well layers 15. Accordingly, in place of a structure in which the source electrode 18 is in contact with both of the source layers 14 and the well layers 15 in the same plane, the MOSFET 1 adopts a three-dimensional trench contact structure, i.e. the trench source structures 16. In the trench source structures 16, the source electrode 18 is in contact with the source layers 14 on the sides of the source layers 14. This considerably reduces the contact area when the semiconductor substrate 10 is seen in plan view from the one thickness direction side, and enables miniaturization of the unit cell structures.

Next, a method of manufacturing the MOSFET 1 will be described. FIGS. 2 to 20 are diagrams for illustrating a method of manufacturing the MOSFET 1 as an antecedent technique of the present invention. In the following description of the MOSFET 1 manufacturing method, in order to facilitate the understanding, the wafer cleaning process, the mask oxidation process for ion implantation, the overcoat film formation process after source electrode formation, the barrier metal formation process, and the back polishing process are not described.

Figure 2:
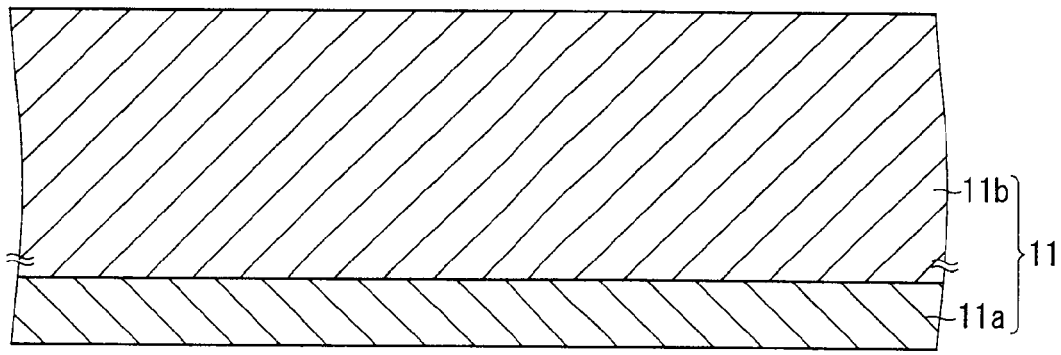
FIG. 2 is a cross-sectional view illustrating an n type semiconductor substrate 11.

FIG. 2 is a cross sectional view illustrating an n type semiconductor substrate 11. First, as shown in FIG. 2, an n type semiconductor substrate 11 is prepared as a wafer in which the n− layer 11b is formed by epitaxial growth on the surface of the n+ substrate 11a on the one thickness direction side. Silicon is used as the wafer material.

Figure 3:
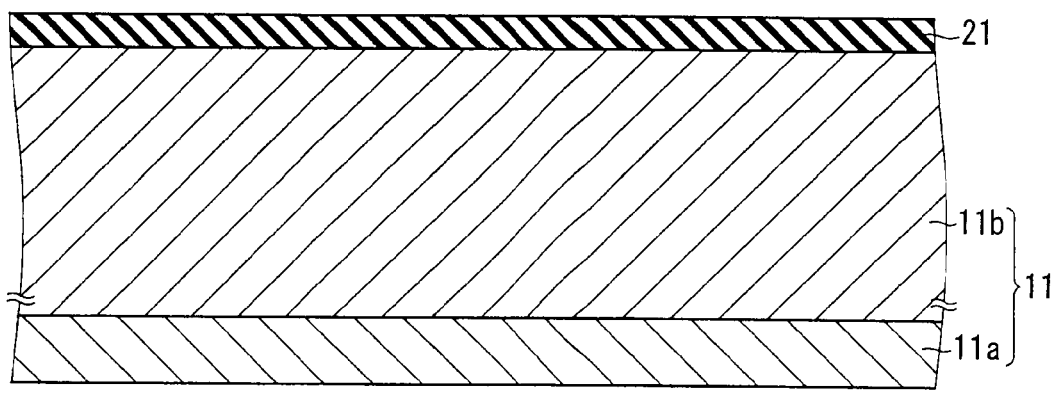
FIG. 3 is a cross-sectional view illustrating the n type semiconductor substrate 11 after a first oxide film 21 has been formed.

FIG. 3 is a cross-sectional view illustrating the n type semiconductor substrate 11 after a first oxide film 21 has been formed. Next, as shown in FIG. 3, a first oxide film 21 is formed on the n type semiconductor substrate 11, more specifically on the entire surface of the n− layer 11b on the one thickness direction side. The first oxide film 21 is a thermal oxide film, for example, and it is formed by thermally oxidizing the surface portion of the n− layer 11b on the one thickness direction side.

Figure 4:
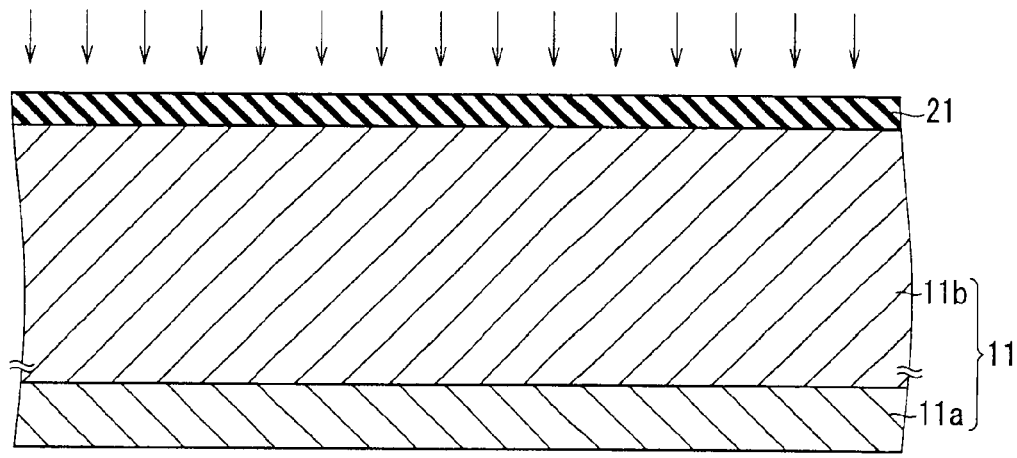
FIG. 4 is a cross-sectional view illustrating the n type semiconductor substrate 11 in a step of applying ion implantation to a portion to be a termination region.

FIG. 4 is a cross-sectional view illustrating the n type semiconductor substrate 11 in a process step of applying ion implantation to a portion that is to become a termination region. The termination region is formed around the transistor region where the unit cells of the MOSFET 1 are formed. For the sake of clarity, FIG. 4 only shows the transistor region without showing the termination region. The first oxide film 21 formed on the n− layer 11b in the termination region is removed by photolithography and etching, to form an opening in the first oxide film 21 in the termination region. As shown in FIG. 4, no opening is formed in the first oxide film 21 in the transistor region. Next, by using the remaining first oxide film 21 as a mask, p type impurity, e.g. boron (B), is ion-implanted into the n– layer 11b in the termination region, and then drive-diffusion is performed to form the termination region as a p type region.

Figure 5:
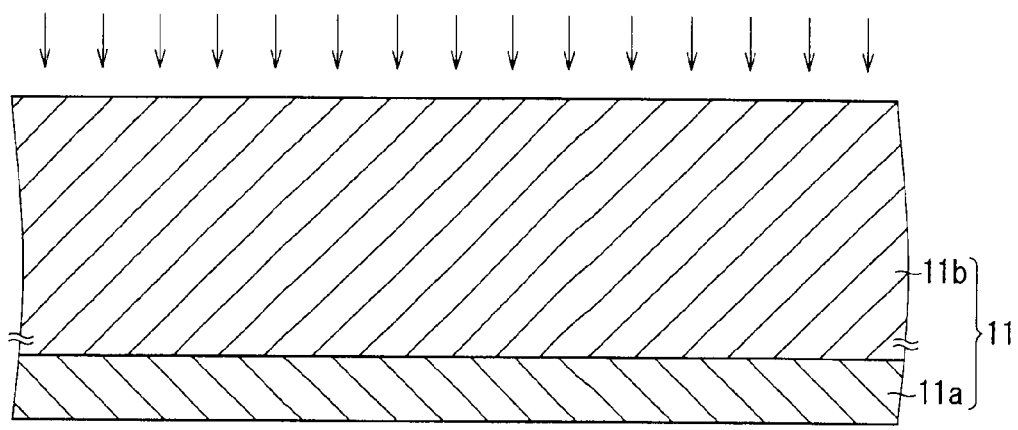
FIG. 5 is a cross-sectional view illustrating the n type semiconductor substrate 11 in a step of applying ion implantation to a portion to be a base layer 12.

FIG. 5 is a cross-sectional view illustrating the n type semiconductor substrate 11 in a process step of ion implantation to the portion that is to become the base layer 12. Next, as shown in FIG. 5, the first oxide film 21 on the n– layer 11b in the transistor region is removed by photolithography and etching, to form an opening in the first oxide film 21 in the transistor region. Next, by using the remaining part of the first oxide film 21 as a mask, p type impurity, e.g. boron, is ion-implanted into the portion of the n– layer 11b that is to become the base layer 12, i.e. into the n– layer 11b in the transistor region.

FIG. 6 is a cross-sectional view illustrating the semiconductor substrate 10A after the base layer 12 has been formed. Next, as shown in FIG. 6, the ion-implanted p type impurity undergoes drive-diffusion to form the base layer 12. The base layer 12 is formed in the surface portion of the n– layer 11b on the one thickness direction side in the transistor region. The n type semiconductor substrate 11 in which the base layer 12 has been formed in the n– layer 11b is referred to as semiconductor substrate 10A.

FIG. 7 is a cross-sectional view illustrating the semiconductor substrate 10A in a process step of ion implantation to a portion where the source layers 14 will be formed. For the sake of clarity, FIG. 7 only shows the transistor region without showing the termination region. A resist pattern is formed by photolithography such that it is opened in the portion in the transistor region where the source layers 14 will be formed, and such that it covers the termination region where the source layers 14 are not needed. As shown in FIG. 7, in the transistor region, the resist pattern is opened and the surface of the base layer 12 is exposed. N type impurity, e.g. arsenic, is ion-implanted through the resist pattern. The n type impurity is thus ion-implanted into the portion of the transistor region where the source layers 14 will be formed, specifically into the portion of the base layer 12 where the source layers 14 will be formed.

FIG. 8 is a cross-sectional view illustrating the semiconductor substrate 10B after the source layer 14 has been formed. Next, as shown in FIG. 8, after the resist pattern has been removed, the ion-implanted n type impurity undergoes drive-diffusion to form a high-concentration n+ type source layer 14. In the transistor region, the source layer 14 is selectively formed in the surface portion of the base layer 12 on the one thickness direction side. The semiconductor substrate 10A in which the source layer 14 has been formed in the base layer 12 is shown by reference character "10B".

FIG. 9 is a cross-sectional view illustrating the semiconductor substrate 10B after a second oxide film 22 has been formed. Next, as shown in FIG. 9, a second oxide film 22 is formed on the entire surface of the semiconductor substrate 10B, specifically, on the entire surface of the source layer 14 forming the surface portion of the transistor region on the one thickness direction side, and on the entire surface of the termination region on the one thickness direction side. The second oxide film 22 is a thermal oxide film, for example, and it is formed by thermally oxidizing the surface portion of the source layer 14 and the termination region on the one thickness direction side.

Figure 10:
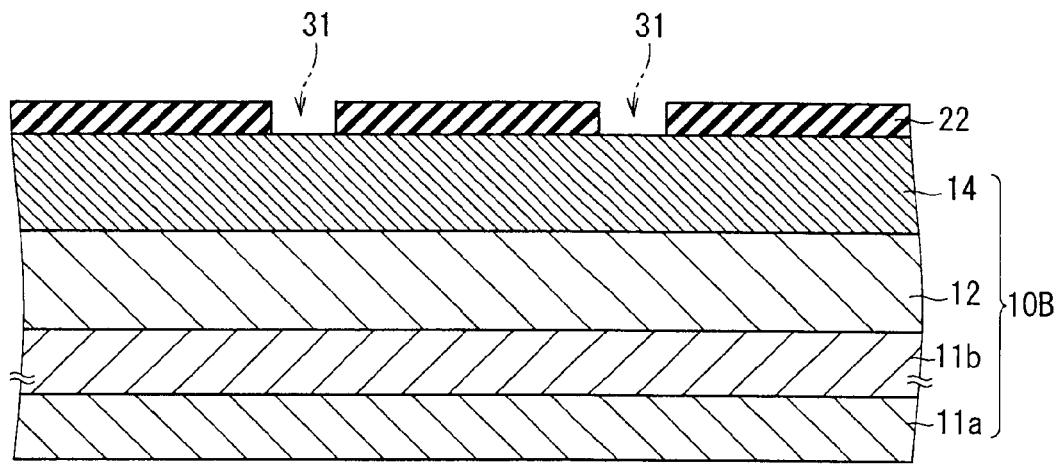
FIG. 10 is a cross-sectional view illustrating the semiconductor substrate 10B after resist used to etch the second oxide film 22 has been removed.

FIG. 10 is a cross-sectional view illustrating the semiconductor substrate 10B after resist used to etch the second oxide film 22 has been removed. Next, a resist pattern is formed by photolithography to form a mask for the gate trenches 31 in which the gate electrodes 33 will be formed. Specifically, the resist pattern is formed such that it opens in the portions where the gate trenches 31 will be formed. By using the resist pattern as a mask, the second oxide film 22 is etched, and the resist is removed. Thus, as shown in FIG. 10, openings are formed in the second oxide film 22 in the portions where the gate trenches 31 will be formed.

Figure 11:
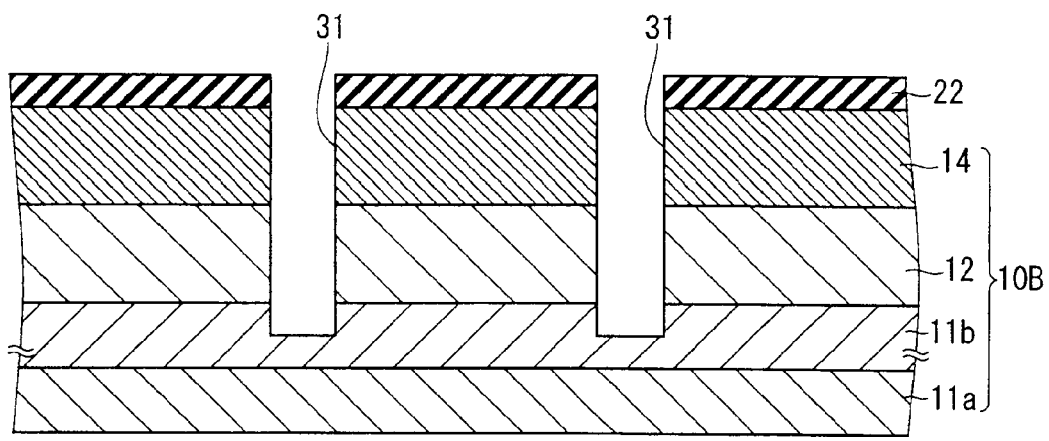
FIG. 11 is a cross-sectional view illustrating the semiconductor substrate 1013 after gate trenches 31 have been formed.

FIG. 11 is a cross-sectional view illustrating the semiconductor substrate 10B after the gate trenches 31 have been formed. Next, as shown in FIG. 11, silicon etching, i.e. etching of the semiconductor substrate 10B, is performed by using the remaining part of the second oxide film 22 as a mask, so as to form the gate trenches 31. Specifically, the gate trenches 31 are formed such that they pass through the source layer 14 and the underlying base layer 12 in the portions exposed in the openings of the second oxide film 22 and they reach the inside of the n– layer 11b.

Figure 12:
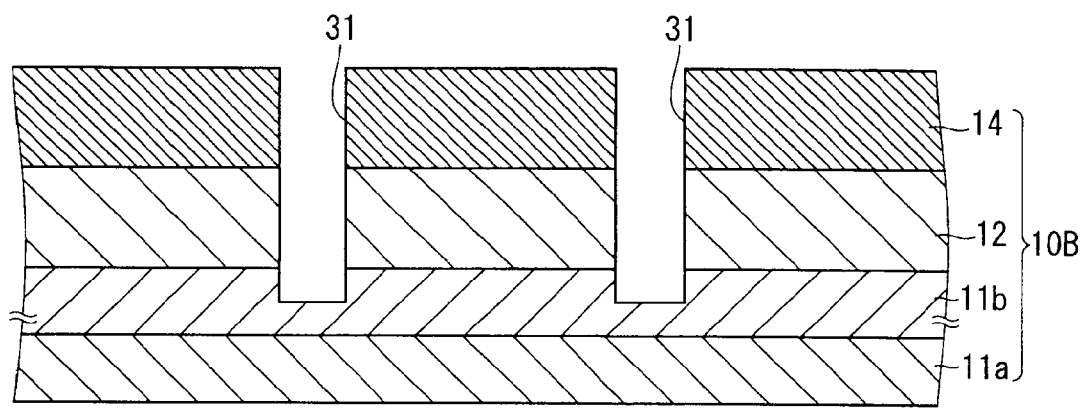
FIG. 12 is a cross-sectional view illustrating the semiconductor substrate 10B after the second oxide film 22 has been removed.

FIG. 12 is a cross-sectional view illustrating the semiconductor substrate 10B after the second oxide film 22 has been removed. Next, as shown in FIG. 12, the second oxide film 22 is removed. Thus, the semiconductor substrate 10B is obtained in which, in the transistor region, the gate trenches 31 extend from the surface of the source layer 14 to reach the inside of the n– layer 11b.

Figure 13:
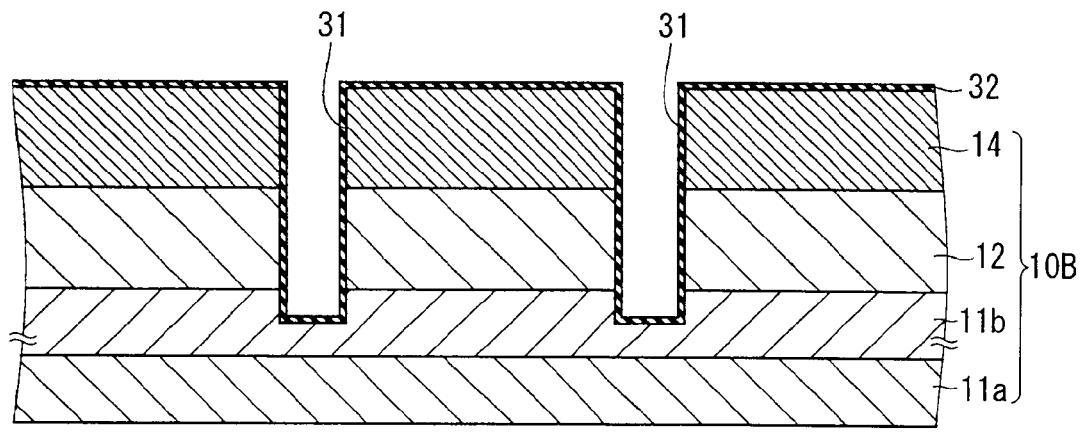
FIG. 13 is a cross-sectional view illustrating the semiconductor substrate 10B after a gate oxide film 32 has been formed.

FIG. 13 is a cross-sectional view illustrating the semiconductor substrate 10B after the gate oxide film 32 has been formed. Next, as shown in FIG. 13, the gate oxide film 32 is formed all over the surface of the semiconductor substrate 10B. Specifically, the gate oxide film 32 is formed on the entire surface of the source layer 14 on the one thickness direction side in the transistor region, on the entire inner surfaces of the gate trenches 31, and on the entire surface of the termination region on the one thickness direction side. The gate oxide film 32 is a thermal oxide film, for example, and it is formed by thermally oxidizing the surface portion of the source layer 14 on the one thickness direction side, the inner surface portions of the gate trenches 31, and the surface portion of the termination region on the one thickness direction side.

Figure 14:
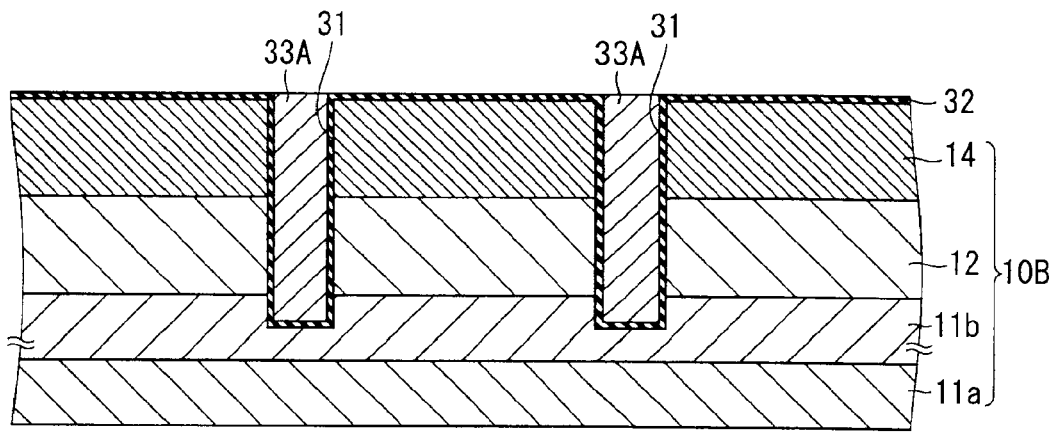
FIG. 14 is a cross-sectional view illustrating the semiconductor substrate 10B after polysilicon layers 33A have been formed.

FIG. 14 is a cross-sectional view illustrating the semiconductor substrate 10B after polysilicon layers 33A have been formed. Next, as shown in FIG. 14, conductive polysilicon is deposited on the entire surface of the semiconductor substrate 10B and etched back, to form polysilicon layers 33A only in the gate trenches 31.

Figure 15:
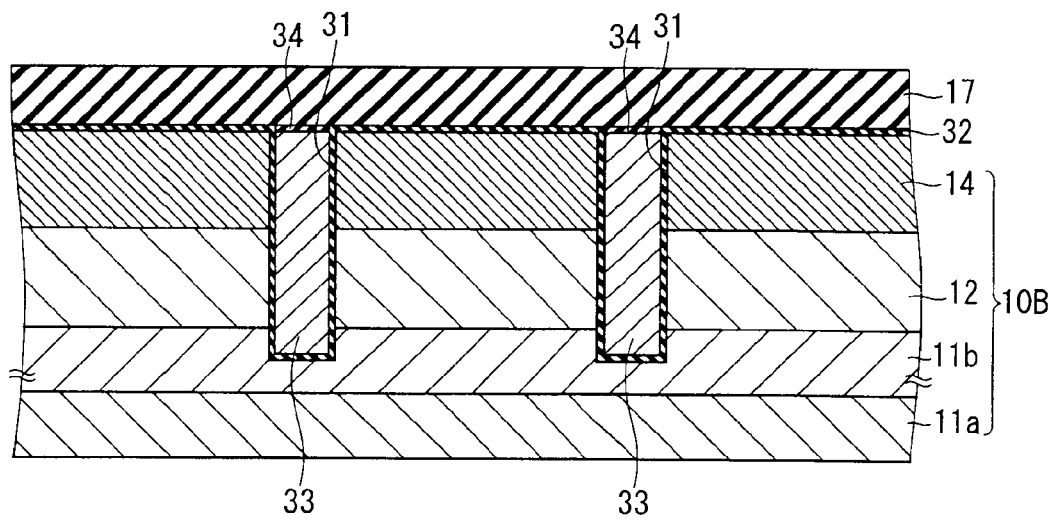
FIG. 15 is a cross-sectional view illustrating the semiconductor substrate 10B after a thick oxide film 17 has been formed.

FIG. 15 is a cross-sectional view illustrating the semiconductor substrate 10B after a thick oxide film 17 has been formed. Next, as shown in FIG. 15, the surfaces of the polysilicon layers 33A formed inside the gate trenches 31 are oxidized to form the cap oxide films 34 covering the polysilicon in the gate trenches 31. Thus, the gate electrodes 33 covered by the cap oxide films 34 are formed. Next, a thick oxide film 17, for insulating the gate electrodes 33, is formed on the entire surface of the semiconductor substrate 10B on the one thickness direction side, specifically on the entire surfaces of the exposed gate oxide film 32 and cap oxide films 34.

Figure 16:
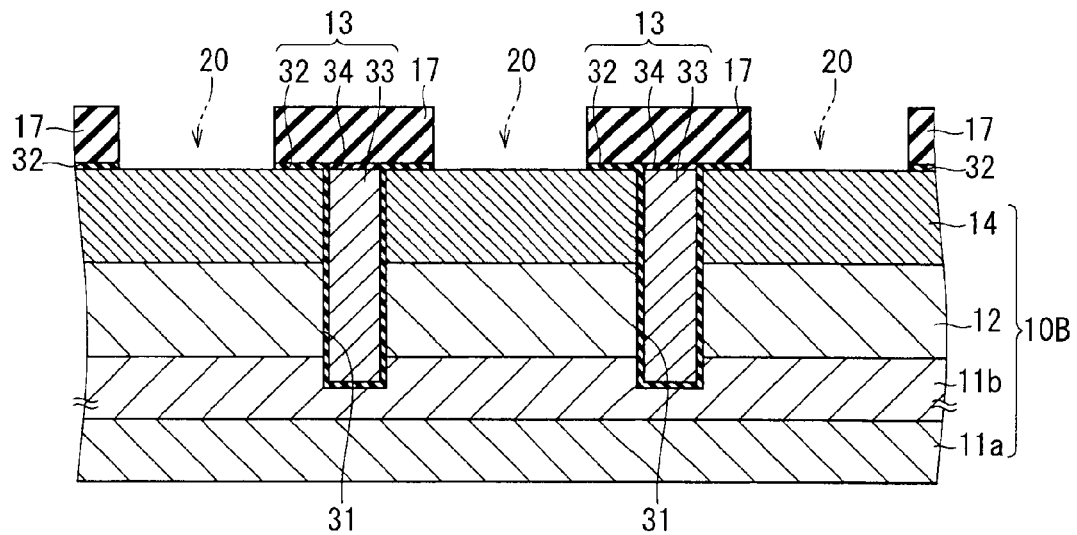
FIG. 16 is a cross-sectional view illustrating the semiconductor substrate 10B after resist used to etch the thick oxide film 17 has been removed.

FIG. 16 is a cross-sectional view illustrating the semiconductor substrate 10B after resist used to etch the thick oxide film 17 has been removed. Next, a resist pattern is formed by photolithography to form a mask for the source trenches 20 serving as contacts of the source electrode 18. Specifically, the resist pattern is formed such that it opens in the portions where the source trenches 20 will be formed. By using the resist pattern as a mask, the thick oxide film 17 and the gate oxide film 32 are etched and then the resist is removed. Thus, as shown in FIG. 16, openings are formed in the thick oxide film 17 and the gate oxide film 32 in the portions where the source trenches 20 will be formed.

Figure 17:
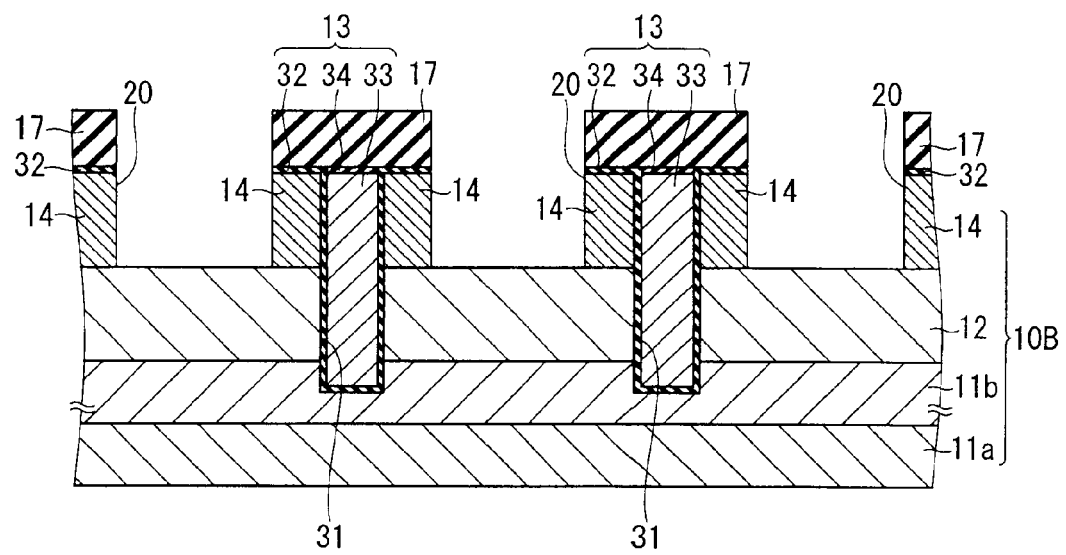
FIG. 17 is a cross-sectional view illustrating the semiconductor substrate 10B after source trenches 20 have been formed.

FIG. 17 is a cross-sectional view illustrating the semiconductor substrate 10B after the source trenches 20 have been formed. Next, as shown in FIG. 17, silicon etching, i.e. etching of the semiconductor substrate 10B, is performed by using the remaining portions of the thick oxide film 17 and the gate oxide film 32 as a mask, so as to form the source trenches 20. Specifically, the source trenches 20 are formed such that they pass through the source layer 14 in the portions exposed in the openings of the thick oxide film 17 and the gate oxide film 32 to reach the surface of the base layer 12.

Figure 18:
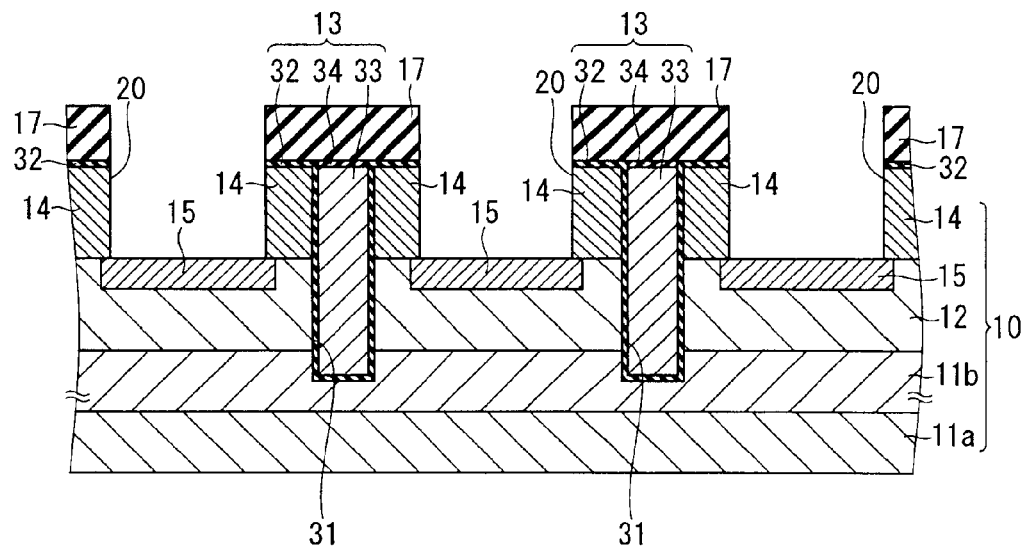
FIG. 18 is a cross-sectional view illustrating the semiconductor substrate 10 after well layers 15 have been formed.

FIG. 18 is a cross-sectional view illustrating the semiconductor substrate 10 after the well layers 15 have been formed. Next, as shown in FIG. 18, p type impurity, e.g. boron, is ion-implanted into the base layer 12 forming the bottoms of the source trenches 20, and then drive-diffusion is performed to form the p+ type well layers 15. The semiconductor substrate 10B in which the well layers 15 have been formed in the base layer 12 is shown by reference character "10".

Figure 19:
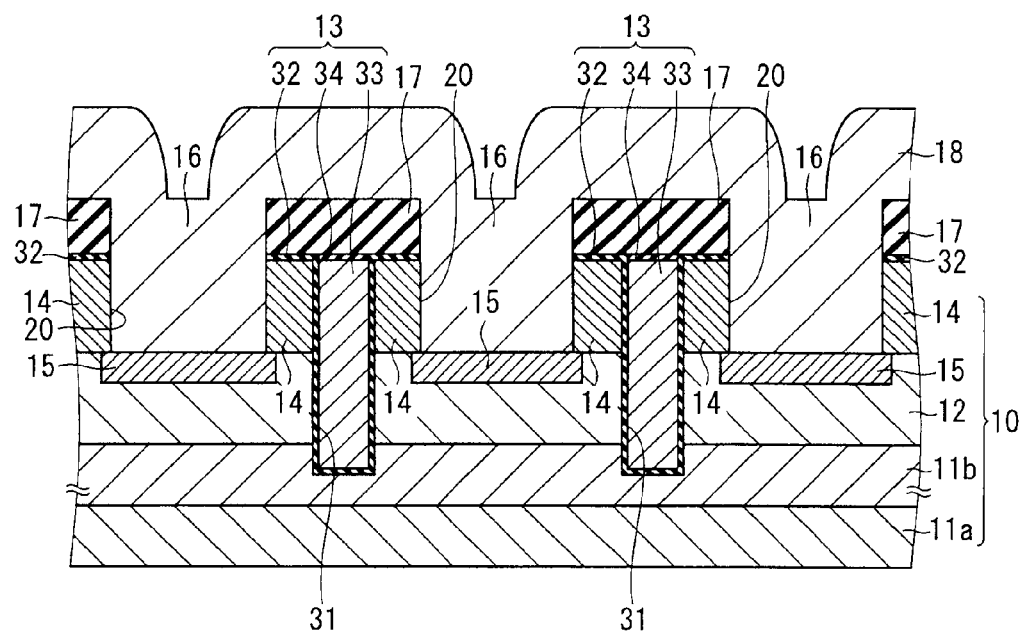
FIG. 19 is a cross-sectional view illustrating the semiconductor substrate 10 after a source electrode 18 has been formed.

FIG. 19 is a cross-sectional view illustrating the semiconductor substrate 10 after the source electrode 18 has been formed. FIG. 19 is a diagram showing the transistor region, and the termination region is not shown, for the sake of clarity of the diagram. Next, a conductive material for the source electrode 18, e.g. Al—Si, is deposited on the entire surface of the semiconductor substrate 10, and it fills the source trenches 20 and forms an electrode film. Next, the electrode film in the termination region etc. where the source electrode 18 is not needed is removed by photolithography and etching to form the source electrode 18. The source electrode 18 is formed in the transistor region as shown in FIG. 19, and not formed in the termination region.

Figure 20:
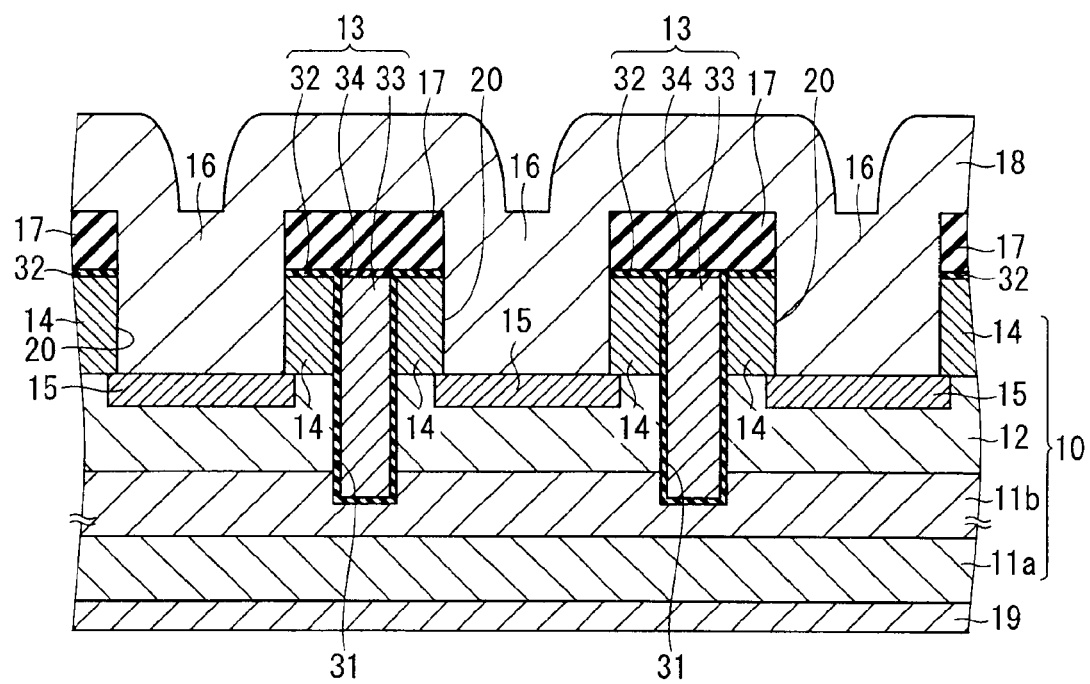
FIG. 20 is a cross-sectional view illustrating the semiconductor substrate 10 after a drain electrode 19 has been formed.

FIG. 20 is a cross-sectional view illustrating the semiconductor substrate 10 after a drain electrode 19 has been formed. Next, as shown in FIG. 20, a drain electrode 19 is formed by, e.g. sputtering, on the surface of the n+ substrate 11a on the other thickness direction side. The MOSFET 1 shown in FIG. 1 is thus obtained.

As described above, in the MOSFET 1 of the antecedent technique of the present invention, the contact portions of the source electrode 18 are formed as trench structures in order to achieve considerable structural miniaturization, and it is a three-dimensional contact structure in which contacts are made with the source layers 14 exposed in the sides of the source trenches 20.

However, it is difficult to fill the source trenches 20 as contact portions with an electrode film of, e.g. Al—Si, by sputtering, and voids are likely to form in the source electrode 18 and such voids increase the electrode resistance. Also, the source electrode 18 rises up over the source trenches 20 and irregularities are formed in the surface of the source electrode 18, which will increase the connection resistance with external interconnections such as wire bonding.

Also, the progress of miniaturization of MOSFET leads to increased gate resistance and to delay in switching due to increased time constant CR. Also, the increased gate resistance causes variations in switching speed in a single chip, causing non-uniform operations.

Furthermore, since a large number of trenches, about twice or more times those in conventional ones, are packed in fine areas, stresses occurring in trench regions cause problems in large-current and high-temperature operating power devices. Excessive stresses will cause crystal defects and increased leakage, and it is therefore necessary to alleviate stresses as much as possible. Accordingly, the semiconductor device of the present invention adopts the structure shown in the following preferred embodiment.

Preferred Embodiment

Figure 21:
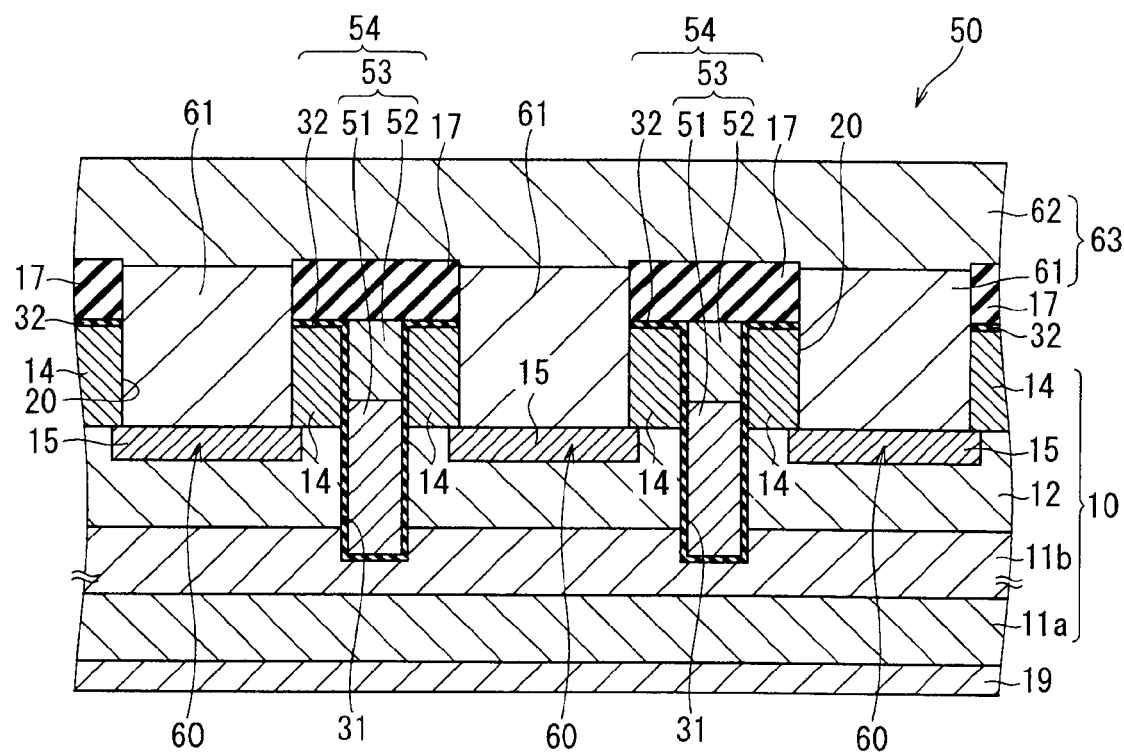
FIG. 21 is a cross-sectional view illustrating a MOSFET 50 as a semiconductor device according to a preferred embodiment of the present invention.

FIG. 21 is a cross-sectional view illustrating a MOSFET 50 as a semiconductor device according to a preferred embodiment of the present invention. The structure of the MOSFET 50 of this preferred embodiment shown in FIG. 21 is similar to the structure of the MOSFET 1 of the antecedent technique shown in FIG. 1. Accordingly, corresponding parts are shown by the same reference characters and common explanations will not be repeated, and differences only will be described below. The MOSFET 50 of this preferred embodiment is suitably used as a power semiconductor device. In this preferred embodiment, the MOSFET 50 as a semiconductor device is an n-channel MOSFET in which a first conductivity type is n type and a second conductivity type is p type. That is to say, in this preferred embodiment, n type corresponds to the first conductivity type and p type corresponds to the second conductivity type. The n− layer 11b corresponds to a first semiconductor layer. The base layer 12 corresponds to a second semiconductor layer. The source layers 14 correspond to a third semiconductor layer. The well layers 15 correspond to a fourth semiconductor layer. The gate oxide film 32 corresponds to a gate insulating film. The thick insulating film 17 corresponds to an interlayer insulating film.

In this preferred embodiment, a source electrode 63 includes source tungsten layers 61 as a first conductor layer provided in source trenches 20, and an AlSi layer 62 as a second conductor layer to which external interconnections, e.g. wire bonding, are connected. That is to say, in this preferred embodiment, the source tungsten layers 61 correspond to a first conductor layer, and the AlSi layer 62 corresponds to a second conductor layer. The source electrode 63 corresponds to a contact electrode. The source trenches 20 correspond to a contact trench.

Thus, the source electrode 63 is composed of the source tungsten layers 61 and AlSi layer 62 made of different materials. The source trenches 20 that form trench source structures 60 are filled with tungsten to form the source tungsten layers 61. The source tungsten layers 61 form a lower-layer structure of the source electrode 63. The AlSi layer 62 is provided as an upper-layer structure of the source electrode 63, and is in contact with the source tungsten layers 61 and covers the source tungsten layers 61 and the thick insulating film 17. The AlSi layer 62 is made of Al—Si. The source electrode 63 is in contact with the source layers 14 and well layers 15 as the source tungsten layers 61 are buried in the source trenches 20.

Also, in this preferred embodiment, a gate electrode 53 that forms a trench gate structure 54 includes a polysilicon layer 51 as an internal gate electrode provided in part of the inside of a gate trench 31 including its bottom, and a gate tungsten layer 52 as a low-resistance gate electrode. That is to say, in this preferred embodiment, the polysilicon layer 51 corresponds to an internal gate electrode and the gate tungsten layer 52 corresponds to a low-resistance gate electrode.

The gate tungsten layer 52 is formed by filling an upper part of the gate trench 31, specifically the vicinity of the opening of the gate trench 31, with tungsten, the same material as that buried in the source trenches 20. The polysilicon layer 51 is formed in the lower part of the gate trench 31, specifically from the bottom of the gate trench 31 to a middle part, and it forms the lower part of the gate electrode 53. In this way, the polysilicon layer 51 is buried in part of the gate trench 31 including its bottom. The gate tungsten layer 52 is provided on the polysilicon layer 51. Specifically, the gate tungsten layer 52 is in contact with the polysilicon layer 51, and provided in the remaining part of the inside of the gate trench 31, i.e. in the remaining part excluding the part where the polysilicon layer 51 is formed.

Also, in this preferred embodiment, the lower end of the gate tungsten layer 52 as a low-resistance gate electrode, i.e. its surface in contact with the polysilicon layer 51, is located to the side of the sources layers 14 away from the lower ends of the source layers 14, i.e. away from the interfaces between the source layers 14 and the base layer 12. In other words, the surface of the gate tungsten layer 52 that is in contact with the polysilicon layer 51 is located to the one thickness direction side of the semiconductor substrate 10 away from the interfaces between the source layers 14 and the base layer 12, specifically it is located on the upper side in the plane of FIG. 21 away from the interfaces between the source layers 14 and the base layer 12.

In this way, in this preferred embodiment, the source electrode 63 includes the source tungsten layers 61 as a first conductor layer and the AlSi layer 62 as a second conductor layer. The source electrode 63 is thus divided into the first conductor layer and the second conductor layer, so that most suitable materials can be used respectively as the first conductor layer and the second conductor layer, and they can offer optimum performances respectively.

Specifically, the width of the source trenches 20, which are filled with the first conductor layer, is made narrower as the MOSFET 50 is miniaturized. It is easier to fill such narrow trenches with tungsten, than with other conductive materials such as AlSi. Accordingly, the source trenches 20 can be filled without voids by using tungsten as the material of the first conductor layer. This prevents the increase of the resistance of the source electrode 63 that would be caused by voids. Also, the AlSi layer 62 is prevented from rising up over the source tungsten layers 61, and irregularities are not formed in the surface of the AlSi layer 62 forming the surface of the source electrode 63, and the surface of the source electrode 63 is formed flat. This prevents the increase of the connection resistance with external interconnections that would be caused by surface irregularities.

Also, the AlSi layer 62 as the second conductor layer forms the part of the source electrode 63 to which external interconnections are connected. AlSi is lower resistant than tungsten. Accordingly, by dividing the source electrode 63 into the first conductor layer and the second conductor layer and using AlSi as the material of the second conductor layer, the connection resistance with external interconnections can be kept low to about the same degree as that of a source electrode entirely formed of AlSi. In other words, the source trenches 20 can be filled with the source tungsten layers 61 without increasing the connection resistance with external interconnections. Thus, the increase of the resistance of the source electrode 63, caused by miniaturization, is prevented, and the increase of the connection resistance with external interconnections is also prevented.

Also, in this preferred embodiment, each gate electrode 53 includes a polysilicon layer 51 as an internal gate electrode and a gate tungsten layer 52 as a low-resistance gate electrode. Tungsten is lower resistant than polysilicon. The resistance of the gate electrode is likely to increase as the chip size is reduced, which is called "design shrink". However, by providing the gate tungsten layer 52 and thus forming part of the gate electrode 53 with tungsten, the resistance of the gate electrode, which is likely to increase with design shrink, is kept low, and the gate electrode can be made lower-resistant than when the entire gate electrode is formed of polysilicon, like the gate electrodes 33 of the antecedent technique.

This suppresses the increase of the resistance of the gate electrodes 53 caused by miniaturization, and thus prevents delay due to the gate electrodes 53 and prevents delay in switching caused by increased time constant CR. Also, variations in switching speed in a single chip, resulting from the resistance of the gate electrodes 53, are suppressed, and non-uniform operations of a large number of parallel-connected unit cells are prevented.

Also, in this preferred embodiment, the gate trenches 31 that form the trench gate structures 54 and the source trenches 20 that form the trench source structures 60 are charged with the same material, i.e. tungsten. More specifically, the gate tungsten layers 52 as low-resistance gate electrodes provided in the gate trenches 31, and the source tungsten layers 61 as a first conductor layer provided in the source trenches 20, are made of the same material, i.e. tungsten. This improves the structural uniformity and alleviates stresses occurring in the areas where the gate trenches 31 and source trenches 20 are formed (hereinafter also referred to as "trench portions"). Alleviating stresses suppresses occurrence of crystal defects like dislocations, whereby adverse effects by crystal defects, e.g. increased leakage current, are prevented.

Also, in this preferred embodiment, the lower end of each gate tungsten layer 52 as a low-resistance gate electrode, i.e. its surface in contact with the polysilicon layer 51, is located to the side of the source layer 14 away from the lower ends of the source layers 14, i.e. away from the interfaces between the source layers 14 and the base layer 12. When an ON signal is applied to the gate electrode 53, a channel forms in the base layer 12 under the source layers 14. Then, by placing the lower end of the gate tungsten layer 52 to the side of the source layers 14 away from the lower ends of the source layers 14, the gate tungsten layer 52 as a low-resistance gate electrode is not adjacent to the base layer 12 where a channel is actually formed. Thus, the gate tungsten layer 52 as a low-resistance gate electrode is not adjacent to the channel formed in the base layer 12 when an ON signal is applied to the gate electrode 53, which prevents transient unstable operations during switching etc.

Next, a method of manufacturing the MOSFET 50 as a semiconductor device according to the preferred embodiment of the present invention will be described. FIGS. 22 to 30 are diagrams illustrating a method of manufacturing the MOSFET 50 as a semiconductor device of the preferred embodiment of the present invention. Now, referring to FIGS. 22 to 30, and also referring to FIGS. 2 to 13, the manufacturing method of the MOSFET 50 will be described. In the following description of the MOSFET 50 manufacturing method, in order to facilitate the understanding, the wafer cleaning process, the mask oxidation process for ion implantation, the overcoat film formation process after source electrode formation, the barrier metal formation process, and the back polishing process are not described.

In this preferred embodiment, too, process steps similar to those shown in FIGS. 2 to 13 of the MOSFET 1 manufacturing method of the antecedent technique are first performed. Specifically, first, as shown in FIG. 2, an n type semiconductor substrate 11 is prepared in which an n− layer 11b as a low-concentration n type semiconductor layer is formed by epitaxial growth on a surface, on one thickness direction side, of an n+ substrate 11a as a high-concentration n type semiconductor substrate.

Next, as shown in FIG. 3, a first oxide film 21 is formed on the n type semiconductor substrate 11, specifically on the entire surface of the n− layer 11b on the one thickness direction side. Next, as shown in FIG. 4, the first oxide film 21 is opened in the termination region (not shown) by photolithography, while no opening is formed in the first oxide film 21 in the transistor region. Then, p type impurity, e.g. boron (B), is ion-implanted and drive-diffused to form the termination region.

Next, as shown in FIG. 5, an opening is formed in the first oxide film 21 in the transistor region by photolithography, and p type impurity, e.g. boron, is ion-implanted into the portion of the n− layer 11b that is to become the base layer 12. Next, as shown in FIG. 6, the ion-implanted p type impurity is drive-diffused to form the base layer 12 in the surface portion of the n− layer 11b on the one thickness direction side.

Next, as shown in FIG. 7, a resist pattern is formed by photolithography such that it opens in the portion where the source layers 14 will be formed in the transistor region, and it covers the termination region where the source layers 14 are not needed, and n type impurity, e.g. arsenic, is ion-implanted through the resist pattern. Next, as shown in FIG. 8, after removing the resist pattern, the ion-implanted n type impurity is drive-diffused to selectively form the source layer 14, as a high-concentration n type semiconductor layer, in the surface portion of the base layer 12 in the transistor region on the one thickness direction side. Next, as shown in FIG. 9, a second oxide film 22 is formed on the entire surface of the semiconductor substrate 10B, specifically on the entire surface of the source layer 14 forming the surface of the transistor region and on the entire surface of the termination region.

Next, as shown in FIG. 10, a resist pattern is formed by photolithography such that it forms a mask for the gate trenches 31 in which the gate electrodes 53 will be formed, and the second oxide film 22 is etched by using the resist pattern as a mask, and the resist is removed. Next, as shown in FIG. 11, the silicon that forms the semiconductor substrate 10B is etched by using the remaining second oxide film 22 as a mask, so as to form the gate trenches 31 passing through the source layer 14 and the base layer 12 to reach the n− layer 11b. Next, as shown in FIG. 12, the second oxide film 22 is removed. Next, as shown in FIG. 13, the gate oxide film 32 is formed on the entire surface of the semiconductor substrate 10B. The following process steps of this preferred embodiment are different from those of the antecedent technique.

Figure 22:
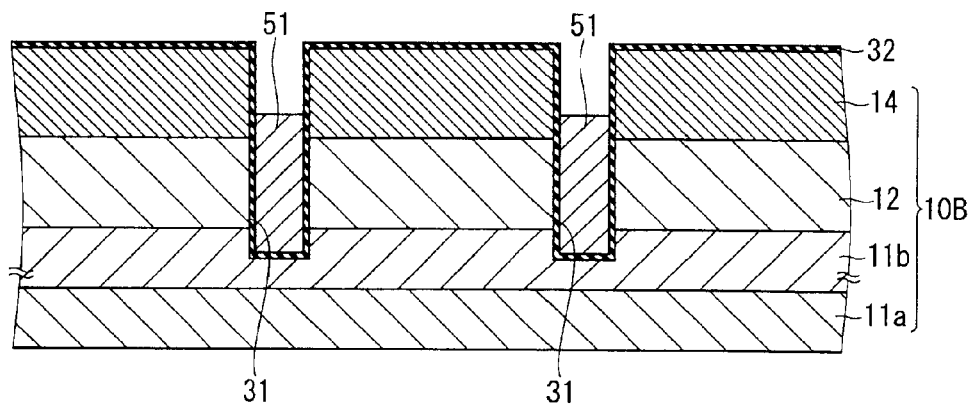
FIG. 22 is a cross-sectional view illustrating a semiconductor substrate 10B after polysilicon layers 51 have been formed.

FIG. 22 is a cross-sectional view illustrating the semiconductor substrate 10B after the polysilicon layers 51 have been formed. Next, as shown in FIG. 22, conductive polysilicon as a conductive material is deposited on the entire surface of the semiconductor substrate 10B, and the polysilicon is etched back. In this preferred embodiment, the polysilicon layers 51 are formed only inside the gate trenches 31, and the polysilicon is etched back until the upper ends of the polysilicon layers 51, i.e. their surfaces on the one thickness direction side, are positioned to the other thickness direction side, i.e. to the lower side in FIG. 22, away from the surface of the semiconductor substrate 10B as a wafer, i.e. away from the surface of the source layer 14 on the one thickness direction side.

More specifically, the polysilicon is etched back until the surfaces of the etched-back polysilicon layers 51 on the one thickness direction side are located to the other thickness direction side away from the surface of the source layer 14 on the one thickness direction side, and to the one thickness direction side away from the surface of the source layer 14 on the other thickness direction side. That is to say, the polysilicon is etched back until the surfaces of the etched-back polysilicon layers 51 on the one thickness direction side are located inside the source layer 14. Thus, polysilicon as conductive material is placed in parts of the insides of the gate trenches 31, including their bottoms, with the gate oxide film 32 interposed therebetween, whereby the polysilicon layers 51 are formed.

Figure 23:
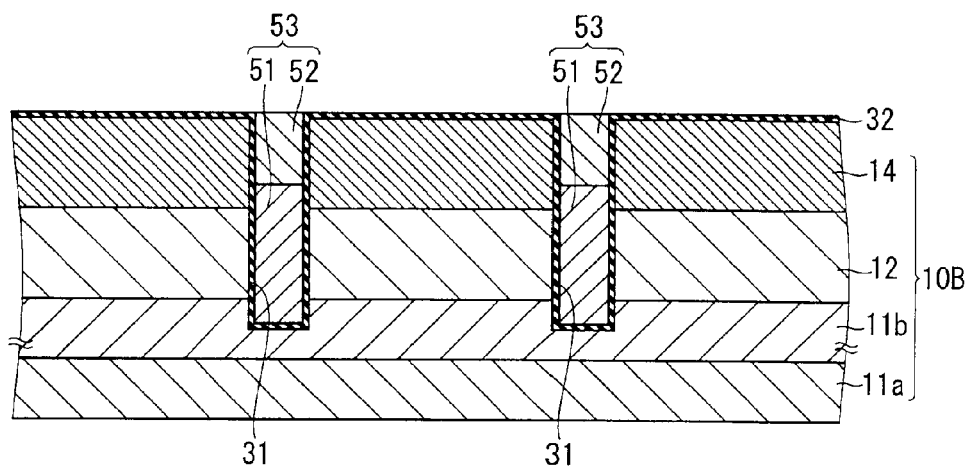
FIG. 23 is a cross-sectional view illustrating the semiconductor substrate 10B after gate tungsten layers 52 have been formed.

FIG. 23 is a cross-sectional view illustrating the semiconductor substrate 10B after the gate tungsten layers 52 have been formed. Next, as shown in FIG. 23, tungsten, for the gate tungsten layers 52 as low-resistance gate electrodes, is deposited on the entire surface of the semiconductor substrate 10B and etched back such that the gate tungsten layers 52 are formed only inside the gate trenches 31. The gate electrodes 53 are thus formed. In the thickness direction of the semiconductor substrate 10B, the tungsten is etched back until the position of the upper ends of the gate tungsten layers 52, i.e. their surfaces on the one thickness direction side, becomes nearly equal to the position of the surface of the semiconductor substrate 10B on the one thickness direction side. Thus, tungsten, a lower-resistant conductive material than polysilicon, is placed in the remaining parts of the gate trenches 31, i.e. in the remaining parts excluding the portions where the polysilicon layers 51 have been formed, with the gate oxide film 32 interposed therebetween. The gate tungsten layers 52 are thus formed in contact with the polysilicon layers 51. The gate electrodes 33 are thus formed. The gate electrodes 33 are thus formed in the gate trenches 31 with the gate oxide film 32 interposed therebetween.

Figure 24:
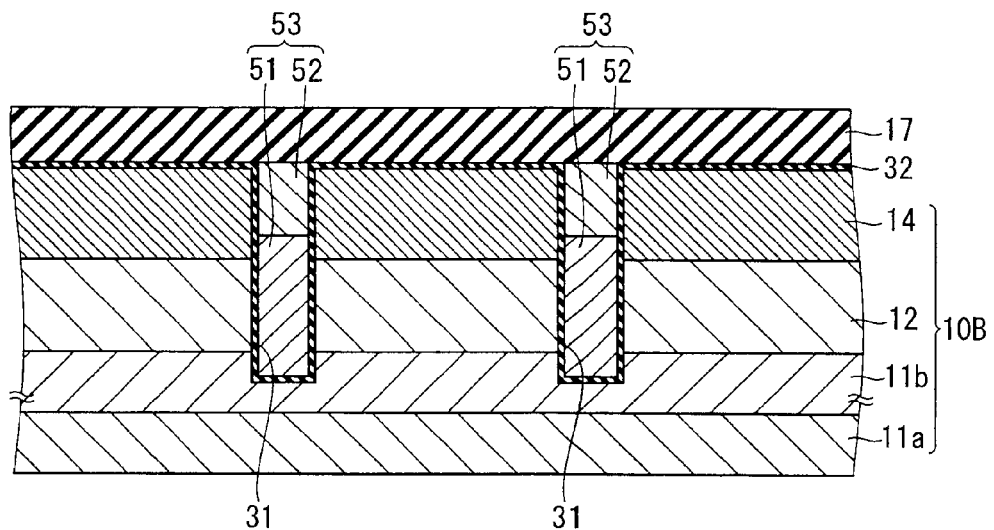
FIG. 24 is a cross-sectional view illustrating the semiconductor substrate 10B after a thick oxide film 17 has been formed.

FIG. 24 is a cross-sectional view illustrating the semiconductor substrate 10B after the thick oxide film 17 has been formed. Next, as shown in FIG. 24, the thick oxide film 17 for insulating the gate electrodes 53 is formed on the entire surface of the semiconductor substrate 10B on the one thickness direction side, specifically on the entire surfaces of the exposed gate oxide film 32 and gate tungsten layers 52.

Figure 25:
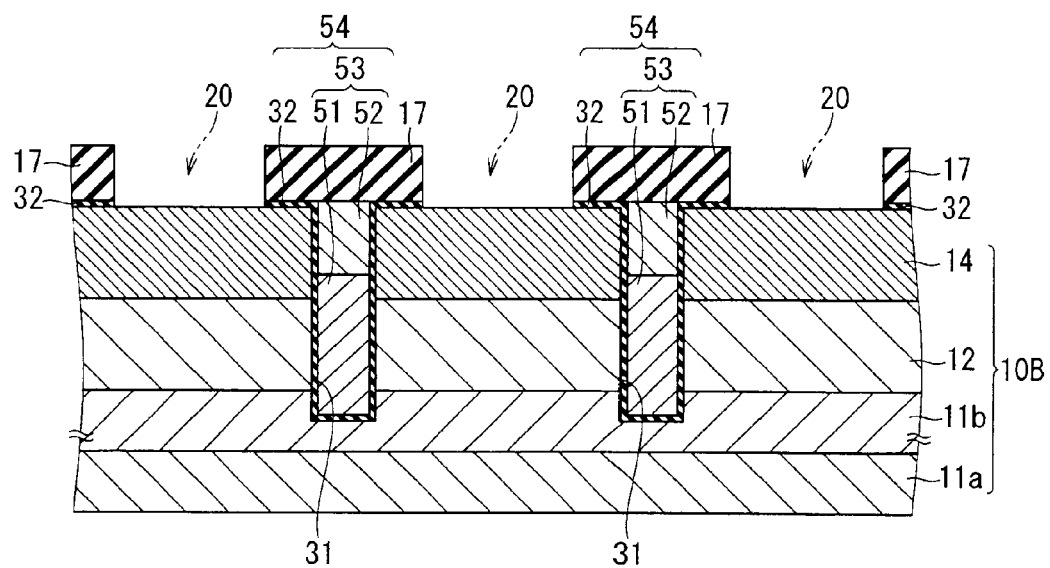
FIG. 25 is a cross-sectional view illustrating a semiconductor substrate 10B after resist used to etch the thick oxide film 17 has been removed.

FIG. 25 is a cross-sectional view illustrating the semiconductor substrate 10B after resist used to etch the thick oxide film 17 has been removed. Next, as in the process step shown in FIG. 16, a resist pattern is formed by photolithography such that it forms a mask for the source trenches 20 as contacts of the source electrode 63. By using the resist pattern as a mask, the thick oxide film 17 and the gate oxide film 32 are etched, and the resist is removed. Thus, as shown in FIG. 25, openings are formed in the thick oxide film 17 and the gate oxide film 32 in the areas where the source trenches 20 are to be formed.

Figure 26:
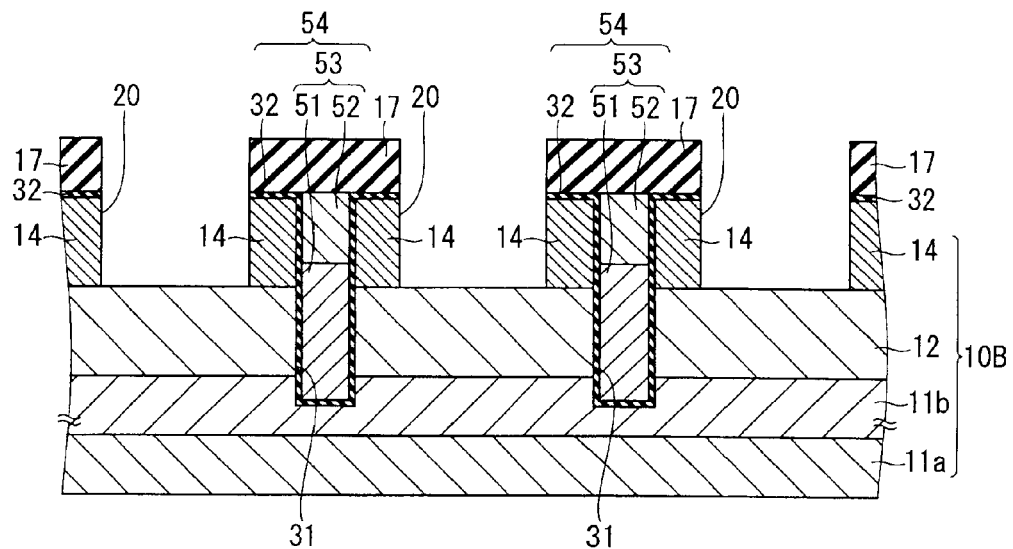
FIG. 26 is a cross-sectional view illustrating the semiconductor substrate 10B after source trenches 20 have been formed.

FIG. 26 is a cross-sectional view illustrating the semiconductor substrate 10B after the source trenches 20 have been formed. Next, as shown in FIG. 26, as in the process step shown in FIG. 17, the silicon that forms the semiconductor substrate 10B is etched by using the remaining thick oxide film 17 and the gate oxide film 32 as a mask, so as to form the source trenches 20 passing through the source layer 14 to reach the base layer 12.

Figure 27:
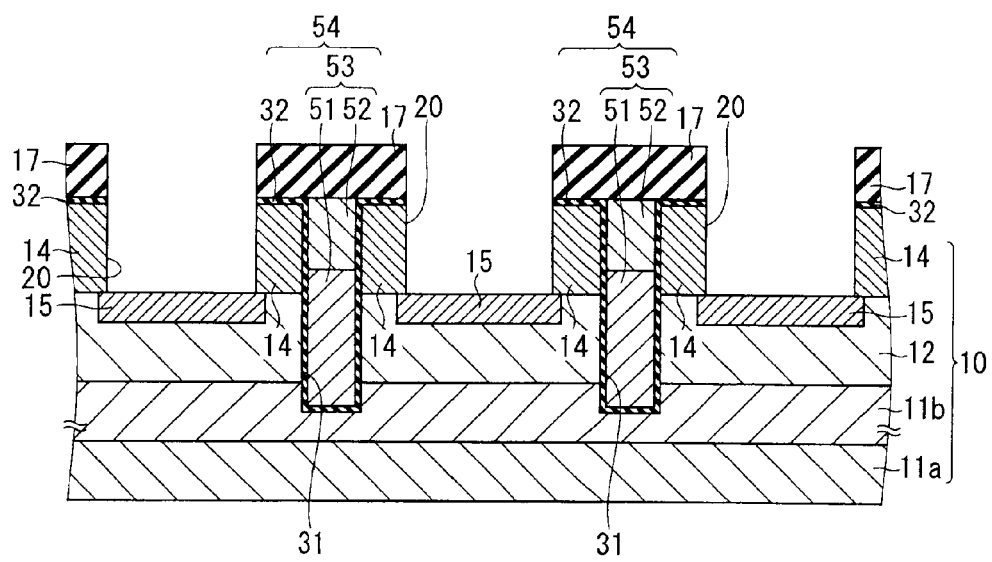
FIG. 27 is a cross-sectional view illustrating the semiconductor substrate 10 after well layers 15 have been formed.

FIG. 27 is a cross-sectional view illustrating the semiconductor substrate 10 after the well layers 15 have been formed. Next, as shown in FIG. 27, as in the process step shown in FIG. 18, p type impurity, e.g. boron, is ion-implanted into the base layer 12 in the portions forming the bottoms of the source trenches 20, and then drive-diffusion is applied to form the well layers 15 as p+ type semiconductor layers of higher concentration of p type impurity than the base layer 12. The semiconductor substrate 10B in which the well layers 15 have been formed in the base layer 12 is shown by reference character "10".

Figure 28:
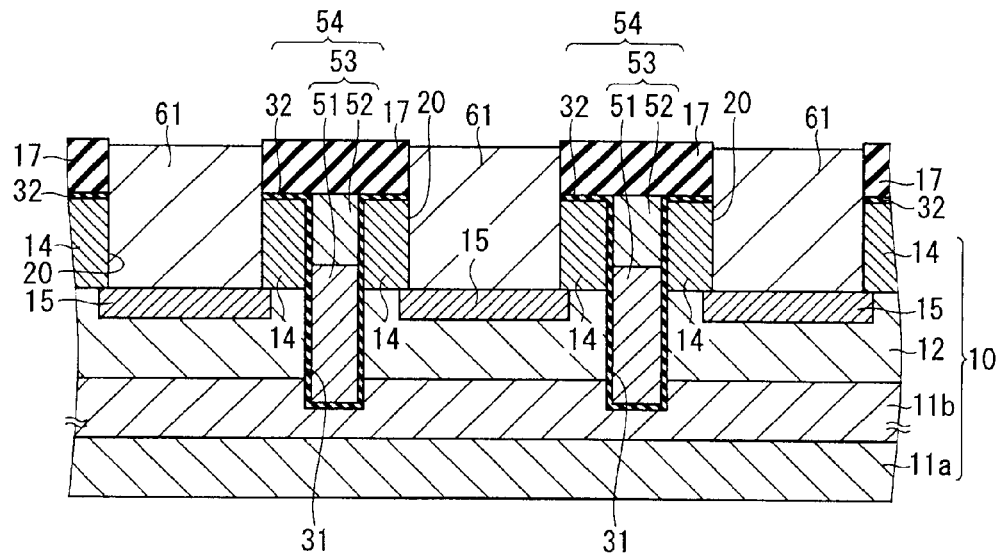
FIG. 28 is a cross-sectional view illustrating the semiconductor substrate 10 after source tungsten layers 61 have been formed.

FIG. 28 is a cross-sectional view illustrating the semiconductor substrate 10 after the source tungsten layers 61 have been formed. Next, as shown in FIG. 28, the source tungsten layers 61 are formed by filling the source trenches 20 with tungsten, the same conductive material as the material of the gate tungsten layers 52 as low-resistance gate electrodes.

Specifically, tungsten is deposited on the entire surface of the semiconductor substrate 10 such that tungsten fills the source trenches 20. Then, tungsten is etched back to form the source tungsten layers 61 only inside the source trenches 20. Thus, the source tungsten layers 61 form the lower layer of the source electrode 63. In this preferred embodiment, the tungsten is etched back to form the source tungsten layers 61 until, in the thickness direction of the semiconductor substrate 10, the upper ends of the source tungsten layers 61, i.e. their surfaces on the one thickness direction side, are located somewhat to the other thickness direction side away from the surface of the semiconductor substrate 10 on the one thickness direction side, i.e. until they are positioned somewhat lower than the surface of the semiconductor substrate 10 in FIG. 28.

Figure 29:
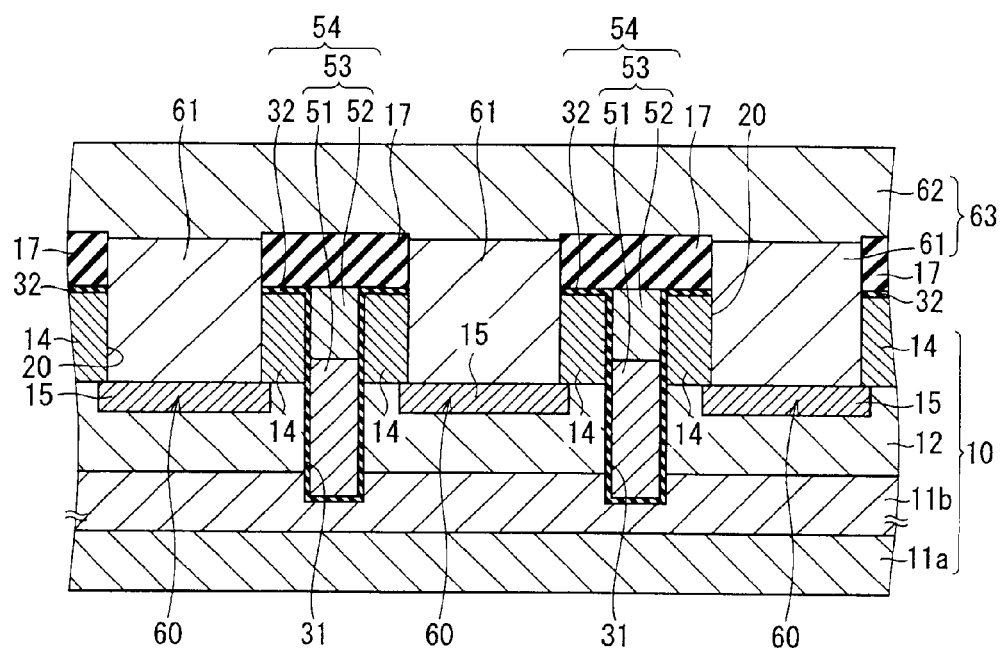
FIG. 29 is a cross-sectional view illustrating the semiconductor substrate 10 after a source electrode 63 has been formed.

FIG. 29 is a cross-sectional view illustrating the semiconductor substrate 10 after the source electrode 63 has been formed. For the sake of clarity, FIG. 29 only shows the transistor region, without showing the termination region. Next, as shown in FIG. 29, a conductive material that is different from the conductive material of the source tungsten layers 61, i.e. Al—Si in this preferred embodiment, is formed to form the AlSi layer 62 that is in contact with the source tungsten layers 61 and that covers the source layers 14 and the gate electrodes 33 with the thick insulating film 17 interposed therebetween.

Specifically, Al—Si is deposited on the entire surface of the semiconductor substrate 10, and Al—Si is removed by photolithography and etching from termination region etc. where the source electrode 63 is not needed, whereby the AlSi layer 62 is formed. The source electrode 63 is thus formed. The source electrode 63 is thus formed such that it is in contact with the source layers 14 and the well layers 15 in the source trenches 20.

Figure 30:
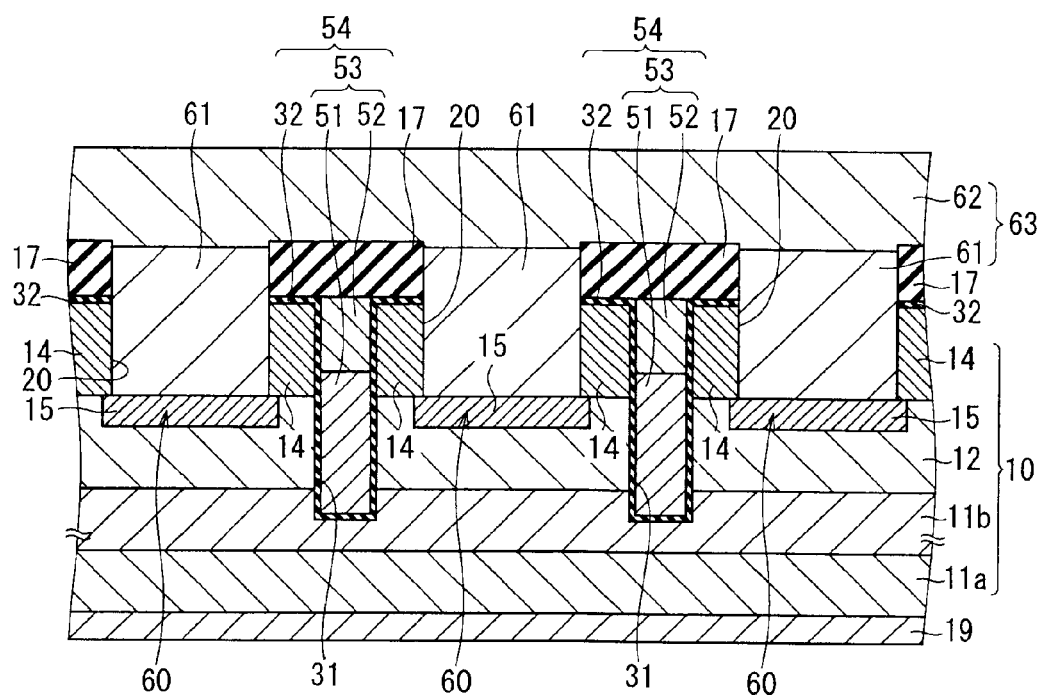
FIG. 30 is a cross-sectional view illustrating the semiconductor substrate 10 after a drain electrode 19 has been formed.

FIG. 30 is a cross-sectional view illustrating the semiconductor substrate 10 after the drain electrode 19 has been formed. Next, as shown in FIG. 30, as in the process step shown in FIG. 20, the drain electrode 19 is formed on the back of the semiconductor substrate 10, or on the back of the wafer, specifically on the surface of the n+ substrate 11a on the other thickness direction side. The MOSFET 50 shown in FIG. 21 is thus obtained.

As described so far, according to the preferred embodiment, tungsten is buried in the source trenches 20 to form the source tungsten layers 61, and then the AlSi layer 62 is formed to cover the source tungsten layers 61 and the thick insulating film 17, whereby the source electrode 63 is formed. Accordingly, the source trenches 20 can be filled without voids, and a low-resistance source electrode 63 can be obtained even when the width of the source trenches 20 is narrowed for miniaturization. Also, irregularities are prevented from forming on the surface of the source electrode 63, and the surface of the source electrode 63 is formed flat, so that the source electrode 63 offers low connection resistance with external interconnections.

Also, according to the preferred embodiment, the gate electrodes 53 are formed by sequentially forming the polysilicon layers 51 and the gate tungsten layers 52 in the gate trenches 31. The low-resistance gate electrodes 53 can thus be formed. It is thus possible to manufacture the MOSFET 50 in which delay in switching due to increased time constant CR is prevented and non-uniform operations of a large number of parallel-connected unit cells are prevented.

Also, in this preferred embodiment, the parts buried in the gate trenches 31 of the gate electrodes 53 and the parts buried in the source trenches 20 of the source electrode 63 are made of the same material, i.e. tungsten. This improves the structural uniformity and alleviates stresses occurring in the trench portions in the MOSFET 50.

The preferred embodiment described so far is meant to be only illustrative and not restrictive, and the structure can be modified within the scope of the present invention. For example, in the preferred embodiment, the MOSFET 50 as a semiconductor device is an n-channel MOSFET in which the first conductivity type is n type and the second conductivity type is p type, but it can be a p-channel MOSFET in which the polarities of dopants are inverted, i.e. the first conductivity type is p type and the second conductivity type is n type.

Also, the preferred embodiment uses silicon as the wafer material, but silicon carbide (SiC) may be used. Techniques using silicon carbide are being developed, and high-efficiency semiconductor devices are expected. The structure of the preferred embodiment can be adopted and the above-described superior effects of the preferred embodiment are obtained also when silicon carbide is used.

Also, the preferred embodiment has described the MOSFET 50 as a semiconductor device, but this is meant only to be illustrative, and the present invention can be applied to other semiconductor devices in which two kinds of electrodes have trench contact structures. For example, it can be applied to insulated gate bipolar transistors (IGBT) in which gate and emitter electrodes have trench contact structures. In the case of IGBTs, the gate electrodes are structured similarly to the gate electrodes 53 of the preferred embodiment, and the emitter electrodes are structured similarly to the source electrodes 63 of the preferred embodiment. The structure of the preferred embodiment can be applied to IGBTs to offer the same superior effects as those of the preferred embodiment.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a first semiconductor layer of a first conductivity type;
   a second semiconductor layer of a second conductivity type formed in a surface portion of said first semiconductor layer on one thickness direction side;
   a third semiconductor layer of the first conductivity type selectively formed in a surface portion of said second semiconductor layer on the one thickness direction side;
   a gate electrode buried in a gate trench passing through said second and third semiconductor layers to reach said first semiconductor layer, with a gate insulating film interposed therebetween;
   a fourth semiconductor layer of the second conductivity type formed in a portion of said second semiconductor layer, the fourth semiconductor layer forming a bottom of a contact trench, the contact trench passing through said third semiconductor layer to reach said second semiconductor layer, said fourth semiconductor layer having a higher concentration of the second conductivity type impurity than said second semiconductor layer, said fourth semiconductor layer and said first conductor layer interfacing along a horizontal plane surface, and said second semiconductor layer and said third semiconductor layer interfacing along the same horizontal plane surface; and
   a contact electrode buried in said contact trench and in contact with said third and fourth semiconductor layers, said gate electrode including:

an internal gate electrode buried in a part of said gate trench including its bottom; and a low-resistance gate electrode buried in a remaining part of said gate trench and in contact with said internal gate electrode, said low-resistance gate electrode having a lower resistance than said internal gate electrode, and said contact electrode including:

a first conductor layer buried in said contact trench; and a second conductor layer that is in contact with said first conductor layer and covers said third semiconductor layer and said gate electrode with an interlayer insulating film interposed therebetween, said first conductor layer and said second conductor layer being made of different materials, and said low-resistance gate electrode and said first conductor layer being made of a same material.

2. The semiconductor device according to claim 1, wherein said low-resistance gate electrode is in contact with said internal gate electrode in a plane that is located to the side of said third semiconductor layer away from an interface between said third semiconductor layer and said second semiconductor layer.

3. The semiconductor device according to claim 1, which is a MOS field effect transistor in which said contact electrode is a source electrode and which comprises a drain electrode on the other thickness direction side of said first semiconductor layer.

4. The semiconductor device according to claim 1, which is an insulated gate bipolar transistor in which said contact electrode is an emitter electrode and which comprises a fifth semiconductor layer of the second conductivity type and a collector electrode on the other thickness direction side of said first semiconductor layer.

5. The semiconductor device according to claim 1, wherein said first to fourth semiconductor layers are formed of silicon carbide.

6. The semiconductor device according to claim 1, wherein a bottom of said contact trench is formed by said fourth semiconductor layer, and a side of said contact trench is formed by said third semiconductor layer.

7. The semiconductor device according to claim 1, wherein said internal gate electrode is filled at a whole bottom of said gate trench.

8. The semiconductor device according to claim 1, wherein the contact trench is formed to reach the second semiconductor layer passing through the third semiconductor layer from openings of the interlayer insulating film.

* * * * *